United States Patent
Granestrand

(10) Patent No.: US 6,826,203 B1
(45) Date of Patent: Nov. 30, 2004

(54) HIGH YIELD DFB LASER WITH EFFECTIVE REJECT SELECTION

(75) Inventor: Per Olov Granestrand, Tyresö (SE)

(73) Assignee: Telefonaktiebolaget LM Ericsson (publ), Stockholm (SE)

(*) Notice: Subject to any disclaimer, the term of this patent is extended or adjusted under 35 U.S.C. 154(b) by 53 days.

(21) Appl. No.: 09/612,128

(22) Filed: Jul. 7, 2000

(30) Foreign Application Priority Data

Jul. 8, 1999  (SE) .............................................. 9902628

(51) Int. Cl.[7] .................................................. H01S 3/10
(52) U.S. Cl. .............................. 372/9; 372/90; 372/43; 372/44; 372/45
(58) Field of Search ................. 372/9, 90, 44, 372/45, 99, 96

(56) References Cited

U.S. PATENT DOCUMENTS

| | | | | |
|---|---|---|---|---|
| 4,653,059 A | * | 3/1987 | Akiba et al. ................... 372/50 |
| 4,740,987 A | * | 4/1988 | McCall et al. ................ 372/96 |
| 4,796,273 A | * | 1/1989 | Yamaguchi ................... 372/96 |
| 4,885,231 A | * | 12/1989 | Chan ........................... 430/321 |
| 5,346,854 A | * | 9/1994 | Ahn et al. ..................... 438/33 |

OTHER PUBLICATIONS

PCT International Search Report No. P10250.

* cited by examiner

*Primary Examiner*—Minsun Oh Harvey
*Assistant Examiner*—Dung Nguyen
(74) *Attorney, Agent, or Firm*—Burns, Doane, Swecker & Mathis, L.L.P.

(57) ABSTRACT

The present invention relates to a high yield DFB laser with an effective reject selection using criteria on threshold current. The demand for high output power often will require use of lasers with asymmetric power distributions with most of the light power coming out from the front mirror. The laser according to the invention preferably has an as-cleaved back mirror, an AR-coated front mirror and a 90-degree phase shift (wavelength/4) positioned at 43% of the laser length counted from the rear mirror. This type of laser gives a good SM-yield, an advantageous power asymmetry and a possibility to select good lasers using the threshold current as selection parameter.

2 Claims, 3 Drawing Sheets

HIGH YIELD DFB LASER WITH EFFECTIVE REJECT SELECTION

This application claims priority under 35 U.S.C. §§119 and/or 365 to 9902628-8 filed in Sweden on Jul. 8, 1999; the entire content of which is hereby incorporated by reference.

TECHNICAL FIELD OF THE INVENTION

The present invention relates to a high yield DFB laser with effective reject selection using criteria on threshold current.

BACKGROUND OF THE INVENTION

In many applications of fibre optics one need good light sources. Desirable properties are high output power, good spectral behaviour (narrow bandwidth), high power efficiency, reasonable driving conditions, high yield, simple testing etc. One commonly used laser type, which to a great extent fulfills these requirements, is the DFB-laser. Traditionally, one use quarter-wavelength-shifted DFB-lasers with AR-coating (Anti Reflective coating) at both mirrors. As a complement or substitute to AR-coating sometimes so-called window structures are used. A window structure is a means to reduce the reflectivity of for example a laser. It is simply realised by termination of the laser waveguide a distance (e.g. 15 microns) from the chip facet. The light will then propagate freely in the bulk material between the waveguide termination and the chip facet. The beam will here diverge and the reflected beam as reflected at the chip facet will continue to diverge. Therefore the reflection coupled back into the laser waveguide will be substantially depressed compared with the case where the waveguide terminates at the chip facet. The quarter-wavelength-shifted DFB-lasers are equipped with a phaseshift of 90 degrees at the midpoint of the laser length. This laser type will in principle give 100% Single-Mode (SM) yield. The SM yield expresses the percentage of fabricated lasers that fulfill a certain spectral-purity requirement. Often this requirement is expressed in the property gain margin, which is the distance in net gain between the lasing mode and the next mode (closest to lasing among the others). However, this laser type will get half of the power in the forward direction and the other half in the backward direction i.e. it will not give any power asymmetry. This means that often these lasers give to little useful output power. Also this laser type gives relatively high threshold currents. To improve these drawbacks one often leave the back-mirror uncoated, with the natural reflectivity, which is typically in the order of 30%. This will give a laser with more power in the forward direction than in the backward direction. Further this will give lower threshold currents than for traditional quarter-wavelength-shifted DFB-lasers. However, when the back mirror is left uncoated the SM-yield will drop for the laser. This means that one has to select the good lasers among the lasers in the fabricated laser population.

As mentioned above, the threshold current and power asymmetry performances are not good enough for the quarter-wavelength-shifted laser for many applications. For the quarter-wavelength-shifted laser with as-cleaved back-mirror mentioned above, the gain-margin-performance is not as good as desired and the need to select lasers by measuring optical spectra makes testing more complicated than what is desired. Also, the lasers that have gain margins that are good enough will have an undesirable spread in power asymmetry among themselves.

SUMMARY OF THE INVENTION

As indicated above, the demand for high output power often will require use of lasers with asymmetric power distributions with most of the light power coming out from the front mirror. One good way to accomplish this is to use lasers with relatively high rear-mirror reflectivity usually obtained by leaving the rear mirror as-cleaved, i.e. without AR-coating. However, by using this type of laser one can not accept all fabricated lasers. Due to the varying phase shifts at the mirrors, some of the lasers will not work with good enough spectral properties and must be sorted out. This sorting is conventionally performed using measurements of the optical spectrum of the laser. This is a relatively complicated measurement. Also, when using conventional lasers some of the samples, which must be thrown away, have among the lowest threshold currents and the best power uniformity in the population, which is an undesirable situation.

The laser of this application, which typically has an as cleaved back mirror, an AR-coated front mirror and a 90 degree phase shift (wavelength/4) positioned at 43% of the laser length counted from the rear mirror, gives good SM-yield, advantageous power asymmetry, and possibility to select the good lasers using the threshold current as selection parameter.

DETAILED DESCRIPTION OF THE PREFERRED EMBODIMENTS

Figure 1:
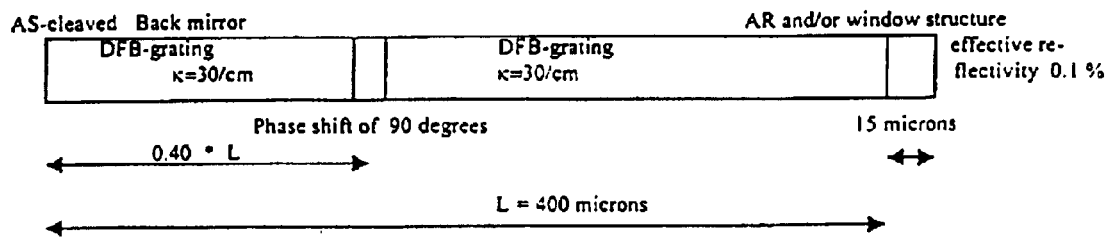
FIG. 1 shows the idea of the invention as a schematic example of the invention.

The idea, see FIG. 1 for schematic example, can be described like this: the laser has a rear mirror with relatively high reflectivity corresponding to mainly an as-cleaved facet or alternatively a HR-coated or lightly AR-coated facet e.g. with a reflectivity of more than 10%. The front mirror is AR-coated and may or may not be combined with a window structure or other reflection-reducing means, giving an effective reflectivity of typically less than 1%. The laser is equipped with a phase shift at a position between 20 and 50% of the laser, counted from the rear mirror. The phase shift has a magnitude of between 40 and 150 degrees. By using such a laser, a laser with good power asymmetry and high single-mode yield, percentage of the lasers fulfilling a demand on the gain-marginal, will be achieved, wherein a possibility to select good lasers will be achieved from the population with high precision by simply checking the threshold currents.

Figure 2:
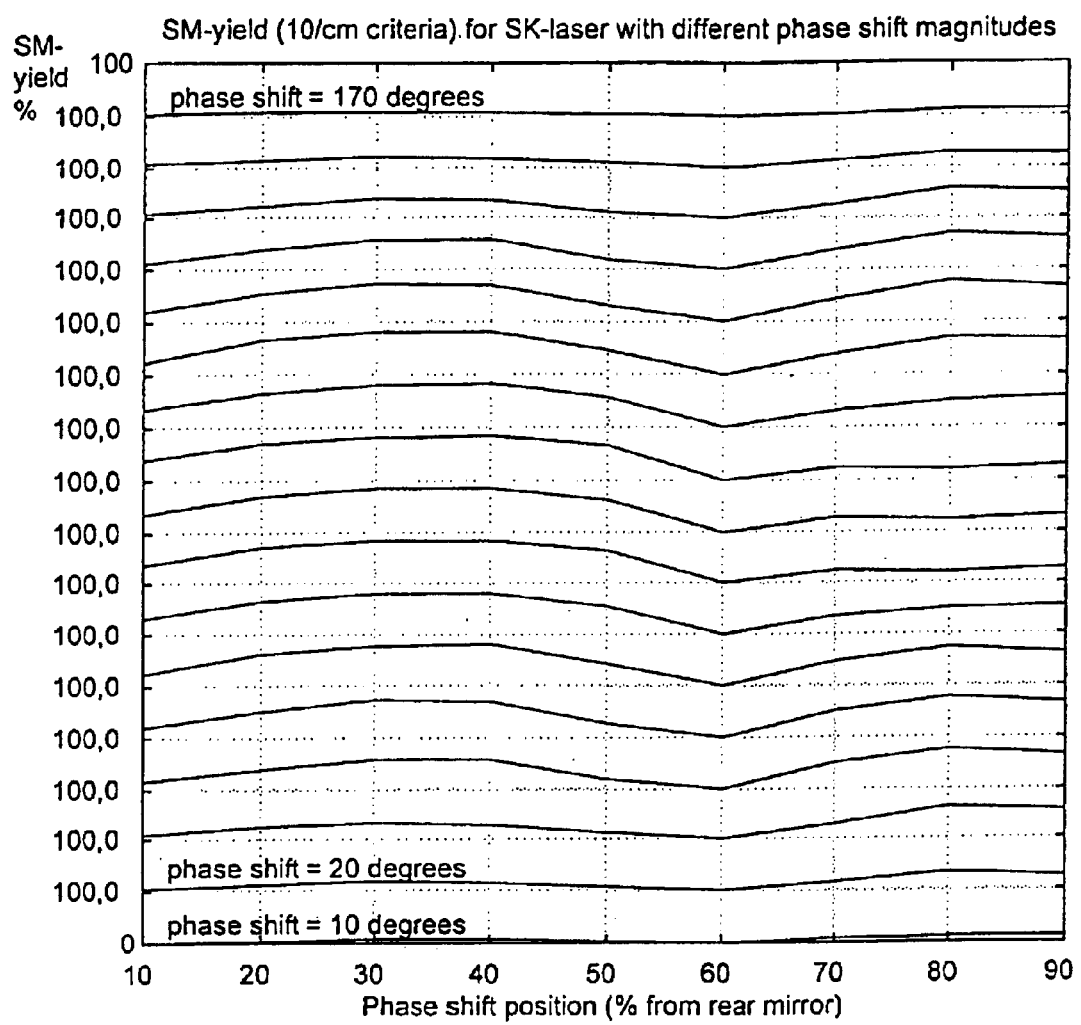
FIG. 2 is a graph for SM-yield for lasers with phase shift between 10 and 170 degrees.

To better understand the idea, FIG. 2 showing Single-mode yield for a general phase-shifted laser, may be considered. The laser is preferably equipped with a cleaved back mirror, a front mirror with a reflectivity of 0.1%, n eff=3.21, a coupling coefficient of 30/cm and a demand on the gain-marginal of 10/cm. In the figure the Single Mode-yield, percentage of lasers fulfilling the gain margin requirements, Is shown for a number of different values of the phase shift from 10 to 170 degrees. The diagram actually consists of a stack of 17 diagrams, all with y-axis ranging from 0 to 100%. The x-axis indicates the phase shift position along the laser in percent counted from rear mirror.

Figure 3:
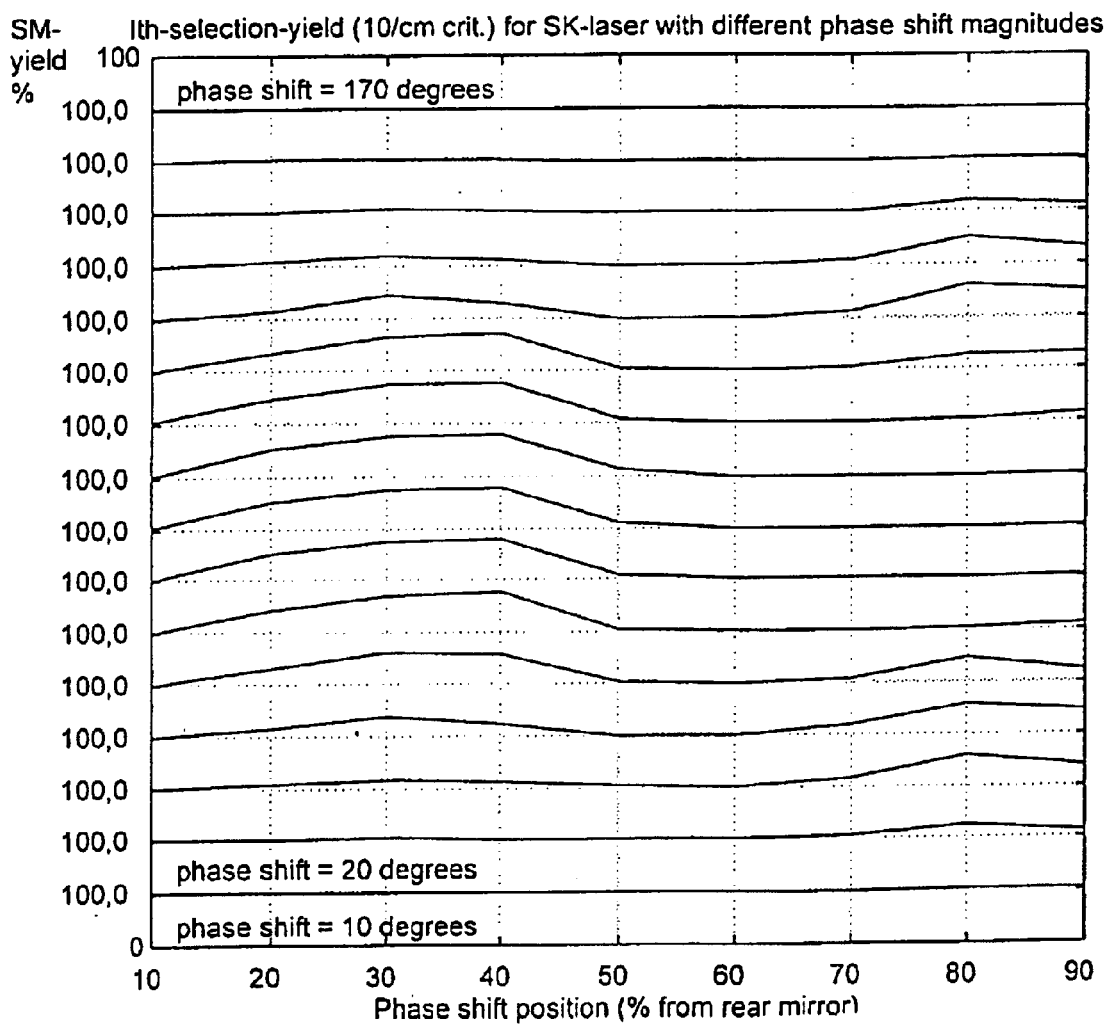
FIG. 3 is a graph for yield for lasers with threshold current as selection parameter, wherein phase shift between 10 and 170 degrees and phase shift positions between 10 and 90% are considered.

Further consider corresponding FIG. 3 for the yield using the threshold current as selection parameter. The calculation Is performed as follows: first evaluate a large number of lasers with different mirror phase shifts and then calculate gain-margin for the lasers. Also calculate threshold current for the lasers and then check from calculated data which lasers must be discarded due to poor gain margin. Among these lasers then find the lowest threshold current. Assume then that among all lasers the samples with threshold currents above this value are discarded. This gives directly the yield using the threshold current as selection parameter as 100%—percentage of discarded lasers.

As can be seen in these FIGS. 2 and 3 the proposed laser with a phase shift of around 90 degrees at about 40 percent of the laser length has the best performance both when considering SM-yield in general and yield when using selection on threshold current.

Figure 4:
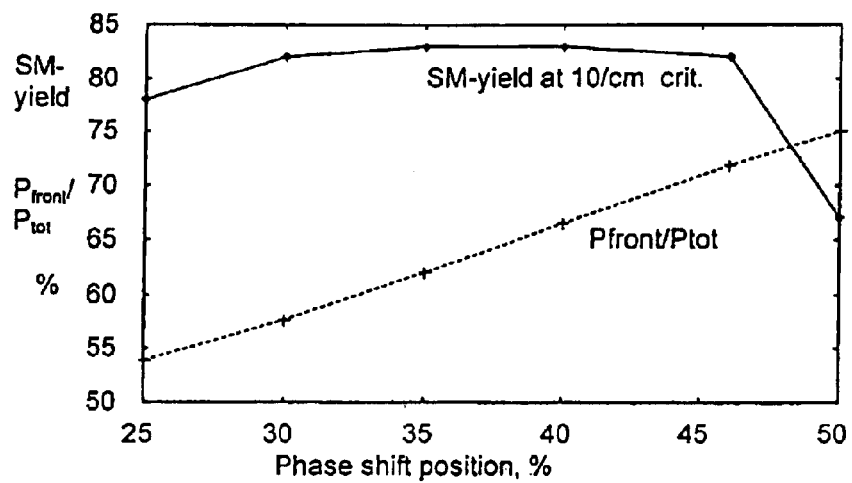
FIG. 4 is a graph for SM-yield and power asymmetry for lasers with 90 degrees phase shift.

Further, it is of great importance to have a laser, which gives as much useful power in the forward direction as possible. The laser of the present invention is better than conventional lasers in this respect. To further explain this point, in FIG. 4 there is shown a plot of average power asymmetry and Single-Mode (SM) yield as a function of the position of the phase shift for a laser with a phase shift magnitude of 90 degrees. As can be seen in the FIG. 4, if one need to combine high SM-yield with good power asymmetry the region 40 to 46% for the phase shift is of special importance.

One important application of the invention is as light source in an integrated DFB-modulator circuit. The modulator can, for example, be of the electro-absorption or Mach-Zehnder interferometer type.

Possible variations of the invention may include additional phase shifts in the vicinity of 180 degrees placed anywhere in the structure, which do not alter the basic behaviour of the laser, though it may have some correcting effect. Another variation may be to specify specific definitions for the case with high reflective (HR) coating on the rear mirror, which may be of interest to increase the optical power from the chip and may have an optimum phase shift closer to the rear mirror.

The yield of the laser process is very important to keep costs down and to be able to perform good production planning. Also, if a simpler selection procedure could be used costs would drop even more. The present idea addresses both these issues. Another advantage is that the proposed laser has a reduced variation in power asymmetry among approved lasers, which gives more homogenous properties of the lasers.

While the foregoing description includes a numerous of details and specificity's, it is to be understand that these are merely illustrative of the present invention and are not to be construed as limitations. Many modifications will be readily apparent to those skilled in the art, which do not depart from the spirit and the scope of the invention as defined by the appended claims and their legal equivalents

What is claimed is:

1. A method of testing a distributed feedback (DFB) laser to determine whether a gain margin value of the DFB laser exceeds a minimum gain margin value, wherein said testing is based on a threshold current value measured in the DFB laser, the method comprising:

determining a maximum threshold current value, said determining comprising:

calculating a corresponding gain margin value and threshold current value for each of a plurality of DFB lasers;

identifying, from among the plurality of DFS lasers, a subset of DFB lasers for which the corresponding calculated gain margin value is less than the minimum gain margin value;

identifying, from among the calculated threshold current values of the subset of DFB lasers, a lowest calculated threshold current value; and setting the maximum threshold current value to the lowest calculated threshold current value;

measuring a threshold current value of a DFB laser under test; and determining that a gain margin value of the DFB laser under test exceeds the minimum gain margin value when the measured threshold current value does not exceed the maximum threshold current value.

2. The method of claim 1, wherein the plurality of DFB lasers and the DFB laser under test each have a front mirror with a reflectivity of less than 1%, a rear mirror with a reflectivity of more than 10%, and a phase shift region positioned between 20% and 50% of the laser length as determined from the rear minor to provide a wave phase shift of between 40 and 150 degrees.

* * * * *